United States Patent
Balcome et al.

(10) Patent No.: US 8,974,888 B2
(45) Date of Patent: Mar. 10, 2015

(54) PREVENTING CONDUCTIVE ANODIC FILAMENT (CAF) FORMATION BY SEALING DISCONTINUITIES IN GLASS FIBER BUNDLES

(75) Inventors: Gregory E. Balcome, Rochester, MN (US); Brett P. Krull, Urbana, IL (US); Joseph Kuczynski, Rochester, MN (US); Terry G. Ryks, Browndale, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 13/221,268

(22) Filed: Aug. 30, 2011

(65) Prior Publication Data

US 2013/0052409 A1 Feb. 28, 2013

(51) Int. Cl.
 *B32B 3/24* (2006.01)
 *B32B 3/10* (2006.01)
 *H05K 3/28* (2006.01)
 *B32B 5/02* (2006.01)

(52) U.S. Cl.
 CPC .. *B32B 3/10* (2013.01); *H05K 3/28* (2013.01); *B32B 5/02* (2013.01); *B32B 2262/101* (2013.01); *B32B 2383/00* (2013.01); *B32B 2457/08* (2013.01)
 USPC .......................... 428/137; 427/96.8; 427/96.1

(58) Field of Classification Search
 USPC ................................. 428/137; 427/96.8, 96.1
 See application file for complete search history.

(56) References Cited

U.S. PATENT DOCUMENTS

| | | | |
|---|---|---|---|
| 6,344,309 B2 * | 2/2002 | Fukushima et al. | 430/324 |
| 7,615,705 B2 | 11/2009 | Chamberlin et al. | |
| 2002/0058140 A1 | 5/2002 | Dana et al. | |
| 2010/0212944 A1 * | 8/2010 | Gelorme et al. | 174/258 |
| 2013/0014977 A1 * | 1/2013 | Chamberlin et al. | 174/257 |
| 2013/0016465 A1 * | 1/2013 | Chamberlin et al. | 361/679.02 |

OTHER PUBLICATIONS http://www.ami.ac.uk/courses/topics/0152_caf/index.html, "The CAF mechanism," 5 pages, document accessed Aug. 6, 2011.
http://www.wou.edu/las/physci/ch462/redox.htm, "Diagrams That Provide Useful Oxidation-Reduction Information," 5 pages, document accessed Aug. 6, 2011.

(Continued)

*Primary Examiner* — William P Watkins, III
(74) *Attorney, Agent, or Firm* — Matthew J. Bussan (57) ABSTRACT

An enhanced substrate for making a printed circuit board (PCB) includes a silane applied to the ends of glass fibers in via holes. In one embodiment, during a plated through-hole (PTH) via fabrication process, glass fiber bundles exposed in a drilled through-hole are selectively sealed. For example, after the through-hole is drilled in a substrate, the substrate may be subjected to an aqueous silane bath (e.g., an organo trialkoxysilane in an aqueous solution of an acid that acts as a catalyst) to deposit a layer of silane on the exposed glass fiber bundle ends. For example, trialkoxy groups of the silane may react with exposed silanols on the glass to form a siloxane, which is further polymerized to form a silane polymer barrier layer on the exposed glass fiber ends. The barrier layer effectively seals the glass fiber bundles and eliminates the conductive anodic filament (CAF) pathway between PTH vias.

19 Claims, 6 Drawing Sheets

(56) References Cited

OTHER PUBLICATIONS

U.S. Appl. No. 12/718,213 to Boday et al., entitled "Hydrophobic Silane Coating for Preventing Conductive Anodic Filament (CAF) Growth in Printed Circuit Boards," filed Mar. 5, 2010.
Plueddemann, "Silane Coupling Agents," 2nd edition, Plenum Press, New York, 1991, Table 1.10 "Critical Surface Tensions of Silane Coupling Agent Film" (p. 23) and Table 2.2 "Representative Commercial Silanes" (p. 34).
Krull, "IBM Laminate Study Group, Lead-Free Laminate Robustness," IBM PCB Symposium, Dec. 10, 2009, 18 pages. (Document available at: http://www-03.ibm.com/procurement/proweb.nsf/objectdocswebview/filepcb+-+brett+krull+laminate+robustness+symposium+presentation.pdf/$file/brett+krull+laminate+robustness+symposium+presentation.pdf).

* cited by examiner

PREVENTING CONDUCTIVE ANODIC FILAMENT (CAF) FORMATION BY SEALING DISCONTINUITIES IN GLASS FIBER BUNDLES

BACKGROUND OF THE INVENTION

1. Field of Invention

The present invention relates in general to printed circuit boards (PCBs) containing glass fiber substrates. More particularly, the present invention relates to preventing conductive anodic filament (CAF) formation in PCBs by sealing discontinuities in glass fiber bundles.

2. Background Art

Printed circuit boards (PCBs) are commonly constructed of a glass cloth or other glass fiber substrate impregnated with a varnish coating (e.g., epoxy-based resin). One problem experienced with such traditional varnish/glass PCBs is known as conductive anodic filament (CAF) growth, which results from copper dissolution which emanates from the anode of an anode/cathode pair and "grows" subsurface toward the cathode of the anode/cathode pair, frequently along separated glass fiber/varnish coating interfaces. With PCBs, anode/cathode pairs are typically adjacent plated through-holes (PTHs). CAF formation causes a number of reliability issues and can result in catastrophic failure of PCBs, which in some instances can cause fires. The bond between the varnish and the substrate is understood to be an important factor in CAF formation and growth, as is the presence of water at the varnish/glass substrate interface.

A need exists for an enhanced mechanism for preventing conductive anodic filament (CAF) formation and growth in printed circuit boards (PCBs).

SUMMARY OF THE INVENTION

According to the preferred embodiments of the present invention, an enhanced substrate for making a printed circuit board (PCB) includes a silane applied to the ends of glass fibers in via holes. In one embodiment, during a plated through-hole (PTH) via fabrication process, glass fiber bundles exposed in a drilled through-hole are selectively sealed. For example, after the through-hole is drilled in a substrate, the substrate may be subjected to an aqueous silane bath (e.g., an organo trialkoxysilane in an aqueous solution of an acid that acts as a catalyst) to deposit a layer of silane on the exposed glass fiber bundle ends. Immersion process parameters (e.g., temperature, pH, silane concentration, and immersion time) are adjusted to deposit a suitable layer of silane. For example, trialkoxy groups of the silane may react with exposed silanols on the glass to form a siloxane, which is further polymerized to form a silane polymer barrier layer on the exposed glass fiber ends. The barrier layer effectively seals the glass fiber bundles and eliminates the conductive anodic filament (CAF) pathway between PTH vias.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

In accordance with the preferred embodiments of the present invention, an enhanced substrate for making a printed circuit board (PCB) includes a silane applied to the ends of glass fibers in via holes. In one embodiment, during a plated through-hole (PTH) via fabrication process, glass fiber bundles exposed in a drilled through-hole are selectively sealed. For example, after the through-hole is drilled in a substrate, the substrate may be subjected to an aqueous silane bath (e.g., an organo trialkoxysilane in an aqueous solution of an acid that acts as a catalyst) to deposit a layer of silane on the exposed glass fiber bundle ends. Immersion process parameters (e.g., temperature, pH, silane concentration, and immersion time) are adjusted to deposit a suitable layer of silane. For example, trialkoxy groups of the silane may react with exposed silanols on the glass to form a siloxane, which is further polymerized to form a silane polymer barrier layer on the exposed glass fiber ends. The barrier layer effectively seals the glass fiber bundles and eliminates the conductive anodic filament (CAF) pathway between PTH vias.

Printed circuit boards (PCBs) are commonly constructed of a glass cloth or other glass fiber substrate impregnated with a varnish coating (e.g., epoxy-based resin). PCBs are also known as printed wiring boards (PWBs). The glass cloth is typically constructed of bundles of glass fibers woven together in an orthogonal fashion, with the bundles typically being perpendicular to each other. The varnish/glass substrate is laminated to copper foil, forming "cores" which are subsequently etched to form the desired features. These cores are then laminated together using partially cured varnish/glass layers (typically in the form of one or more "prepregs") with temperature and pressure, causing the varnish coating to flow between the layers to form a robust composite laminate structure. A sheet of what is referred to as "prepreg" is a glass cloth impregnated with a resin solution which is either dried or at least partially cured.

Figure 1:
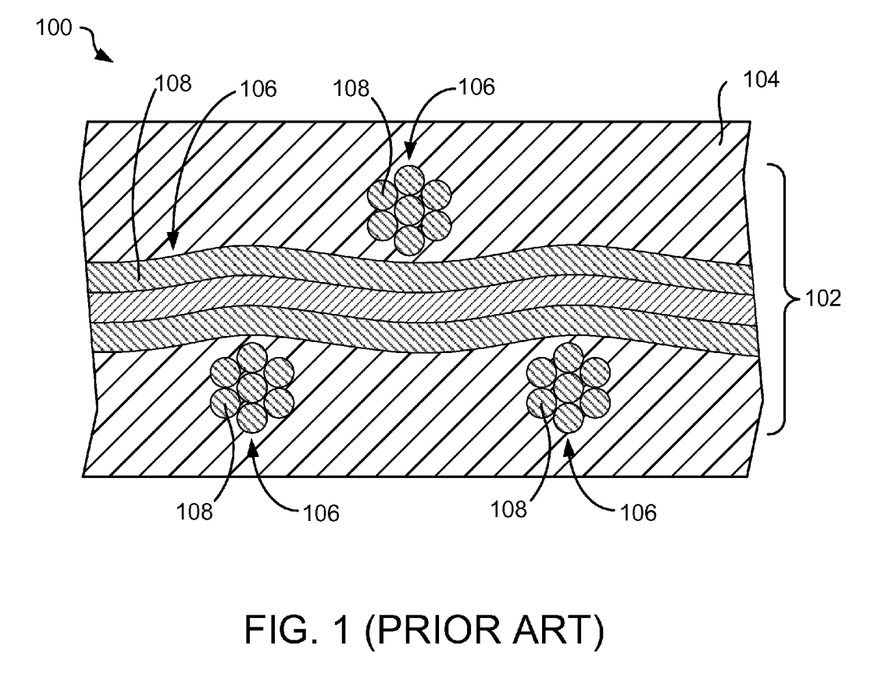
FIG. 1 is a partial, sectional view of a conventional varnish/glass substrate.

FIG. 1 is a cross-sectional view of a conventional varnish/glass substrate 100 that includes a glass cloth 102 impregnated with a varnish coating 104. The glass cloth 102 is constructed of a number of glass fiber bundles 106 that are woven together in an orthogonal fashion. From the perspective illustrated in FIG. 1, the glass fiber bundles 106 extend within the glass cloth 102 in a transverse direction (these bundles extend between left and right, one such glass fiber bundle 106 is shown in FIG. 1) and a normal direction (these bundles extend into the page, three such glass fiber bundles 106 are shown in FIG. 1). Each glass fiber bundle 106 includes two or more individual glass fibers 108 that are typically wound around one another (e.g., in the example shown in FIG. 1, each glass fiber bundle 106 consists of seven individual glass fibers 108—six outer glass fibers wound around a single central glass fiber).

Typically, the varnish coating 104 is an epoxy-based resin, a bismaleimide triazine (BT) resin, polyyphenylene oxide/triallylisocyanurate (TAIC), and combinations thereof.

One problem experienced with traditional varnish/glass PCBs is known as conductive anodic filament (CAF) growth, which results from copper dissolution which emanates from the anode of an anode/cathode pair and "grows" subsurface toward the cathode of the anode/cathode pair, frequently along separated glass fiber/varnish coating interfaces. With PCBs, anode/cathode pairs are typically adjacent plated through-hole (PTH) vias. CAF formation causes a number of reliability issues and can result in catastrophic failure of PCBs, which in some instances can cause fires. The bond between the varnish and the substrate is understood to be an important factor in CAF formation and growth, as is the presence of water at the varnish/glass substrate interface.

Generally, in locations on PCBs where there are sources of copper, an electrical bias, glass fiber, and moisture, the potential exists for the formation of CAF. CAF growth results when a pathway exists along or within the individual glass fibers within the PCB where an undesired conductive path may form. In essence, a conductive filament of copper salts may grow along one or more of the glass fibers when there is both an electrical bias and moisture present, such as when an electronic device operates in a high humidity environment. The conductive filament may eventually grow to a sufficient length to short together two features (i.e., the anode/cathode pair) that should not be connected, such as adjacent PTH vias in the PCB, causing the PCB to fail.

CAF growth has been attributed to one or more of several possible scenarios, including: 1) hollow glass fibers as a result of bubbles in the liquid glass during the extrusion process that forms the glass fibers; 2) insufficient binding of the resin to the glass fibers, which may occur when the resin is initially bound to the glass fibers, or may occur during normal system operation; 3) insufficient impregnation of the resin into the bundles of glass fibers, leaving small open tracks where multiple glass fibers meet (sometimes called a "triple point").

Figure 2:
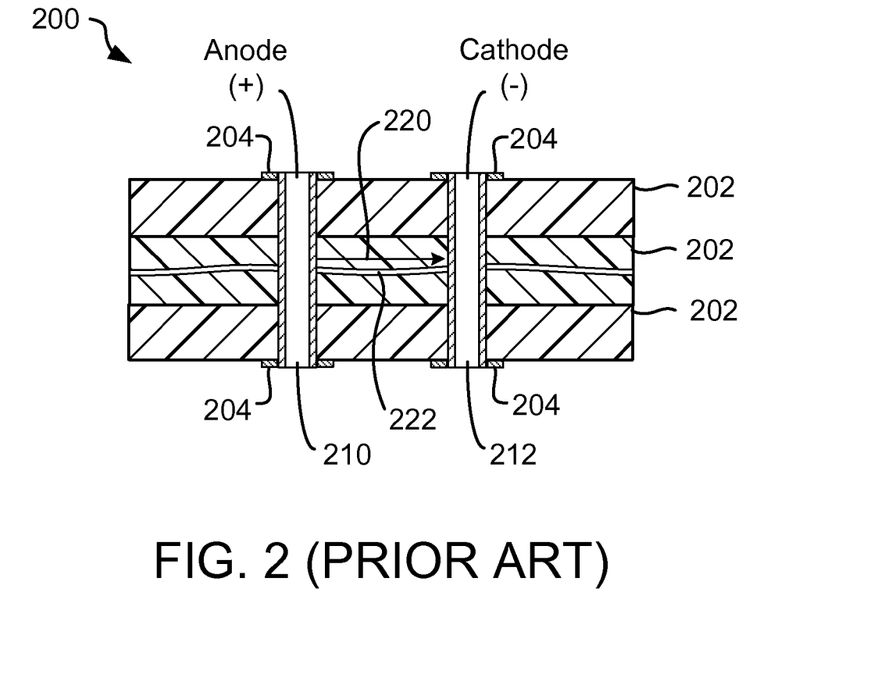
FIG. 2 is a partial, sectional view of a conventional printed circuit board (PCB) with two plated through-hole (PTH) vias that constitute an anode/cathode pair.

The predominant CAF pathway is from PTH via to PTH via along a glass fiber bundle. Typically, a PCB contains a plurality of vias, each electrically connecting a conductive trace on one layer of the PCB to one or more conductive traces on one or more other layers of the PCB. FIG. 2 illustrates an exemplary type of conventional via in a cross-section of a PCB 200 having a plurality of insulator layers 202 and conductive traces 204. Each of the insulator layers 202 shown in FIG. 2 may correspond with the conventional varnish/glass substrate 100 shown in FIG. 1. Typically, vias are electroplated (e.g., copper or other highly conductive metal) onto through-holes drilled into the PCB. Such a via, which extends from one surface of the PCB to the other surface of the PCB, is referred to as a plated through-hole (PTH) via. Two exemplary PTH vias 210 and 212 are illustrated in FIG. 2.

In FIG. 2, PTH vias 210 and 212 constitute an anode/cathode pair due to an electrical bias between the PTH via 210 and the PTH via 212. That is, the PTH via 210 has a voltage higher than that of the PTH via 212. Hence, in FIG. 2, the PTH via 210 is also labeled as "Anode (+)" and the PTH via 212 is also labeled as "Cathode (−)." An exemplary CAF pathway 220 is illustrated in FIG. 2 as a solid line that extends from the Anode PTH via 210 to the Cathode PTH via 212 along a glass fiber bundle 222. The glass fiber bundle 222 shown in FIG. 2 may correspond to one of the glass fiber bundles 106 shown in FIG. 1.

In addition to or in lieu of PTH vias, it is also not uncommon for high layer-count PCBs to have blind vias, which are visible only on one surface of the PCB, and/or buried vias, which are visible on neither surface of the PCB. While the predominant CAF pathway is from PTH via to PTH via along a glass fiber bundle, blind vias and buried vias are each also susceptible to a similar CAF pathway along a glass fiber bundle.

Typically, CAF occurs at the interface where the glass fiber has delaminated from the varnish, which creates a path for water diffusion. The reason this path is commonly associated with CAF formation is due to the exposure of surface silanols on the glass fibers. Silanols always exist on the surface of glass fibers and, thus, there is always a pathway for the formation of CAF. Delamination does not have to occur to create this pathway. Additionally, CAF can occur from pre-existing water adsorbed onto the surface of the glass fiber (i.e., water may be deposited during processing of the glass fibers).

Surface silanols, as mentioned above, always exist on the surface of the glass fiber. These surface silanols are reacted when silane coupling agents, such as vinylbenzylaminoethylaminopropyltrimethoxysilane or diallylpropylisocyanuratetrimethoxysilane, are utilized to couple, or bond, the glass cloth substrate to the laminate varnish. The alkoxy groups on the silicon of the silane coupling agent hydrolyze to silanols, either through the addition of water or from residual water on the surface of the substrate. Subsequently, the silanols react with hydroxyl groups on the surface of the substrate to form a siloxane bond (Si—O—Si) and eliminate water. Unfortunately, residual alkoxy groups on the silane coupling agent hydrolyze and create more silanols. Thus, more surface silanols are created by the silane coupling agent.

For example, when diallylpropylisocyanuratetrimethoxysilane is used as the silane coupling agent, even though the propyl group to which the trialkoxysilane is attached is hydrophobic (retarding ingress of water to the resin/glass interface and improving CAF resistance), surface silanols are nonetheless created. These surface silanols still provide a hydrophilic path for water diffusion, which leads to CAF formation.

Prior solutions to prevent CAF have typically used the addition of surface modifiers such as n-octyltrimethoxysilane and 3-methacryloxypropyltrimethoxysilane when treating glass cloth, but the addition of these silanes requires $CO_2$ reactors which operate at high pressures that are typically unsafe for large scale production. Additionally, the silanes used in this process create silanols, which still provide a hydrophilic path for water diffusion that ultimately leads to CAF formation. Although this process does reduce the likelihood of CAF formation, CAF inevitably occurs nonetheless due to the silanes used as surface modifiers.

Moreover, even when a glass cloth is treated with surface modifiers in conventional processes to prevent CAF, discontinuities in the glass fiber bundles are created when PTH vias, for example, are subsequently fabricated in a PCB. These discontinuities, which are created as through-holes are drilled into the PCB, are in essence laid-bare (untreated) ends of the glass fiber bundles. Hence, these laid-bare ends of the glass fiber bundles provide a ready CAF pathway between adjacent PTH vias.

Figure 3:
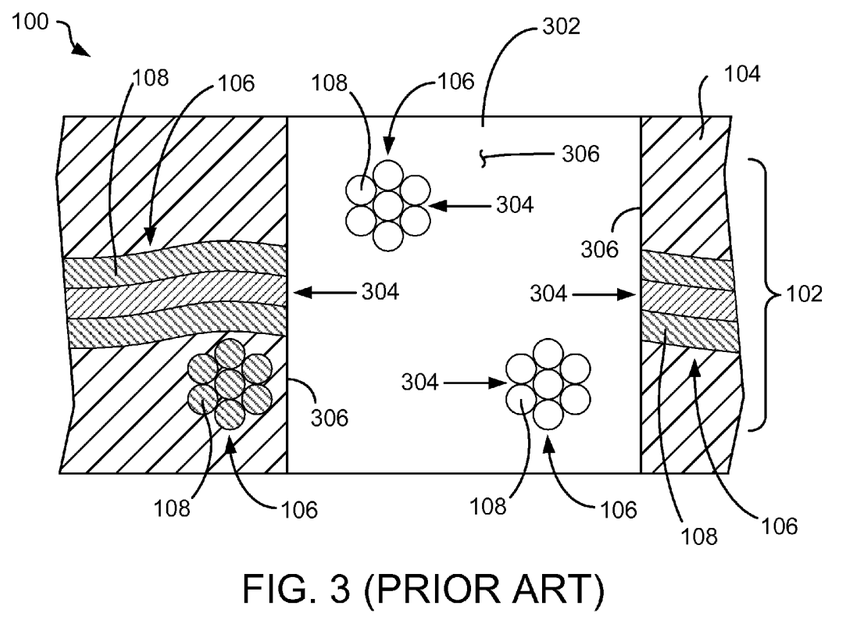
FIG. 3 is a partial, sectional view of the conventional varnish/glass substrate shown in FIG. 1 after a through-hole is drilled through the substrate.

FIG. 3 is a cross-sectional view of the conventional varnish/glass substrate 100 shown in FIG. 1 after a through-hole 302 is drilled therethrough. Note that drilling the through-hole 302 creates several discontinuities 304 in the glass fiber bundles 106 on the wall surface 306 of the through-hole 302. These discontinuities 304, which are in essence laid-bare (untreated) ends of the glass fiber bundles 106, provide a ready CAF pathway between the PTH via that will be formed in through-hole 302 and adjacent PTH vias.

Figure 4:
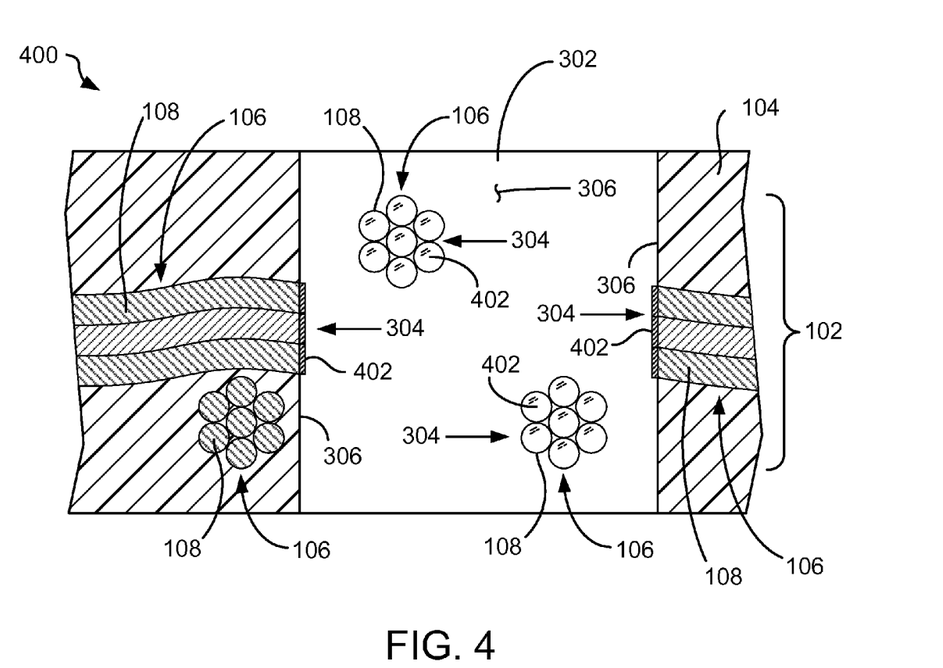
FIG. 4 is a partial, sectional view of an enhanced varnish/glass substrate after at least one silane polymer barrier layer is formed over the ends of glass fibers exposed on a wall surface of a through-hole in accordance with the preferred embodiments of the present invention.

FIG. 4 is a cross-sectional view of an enhanced varnish/glass substrate 400 after at least one silane polymer barrier layer 402 is formed over the ends of glass fibers exposed on a wall surface of a through-hole in accordance with the preferred embodiments of the present invention. The enhanced varnish/glass substrate 400 illustrated in FIG. 4 corresponds to the conventional varnish/glass substrate 100 shown in FIGS. 1 and 3, except that one or more silane polymer barrier layers 402 is/are formed on the end of glass fibers 108 on the wall surface 306 of the through-hole 302 in accordance with the preferred embodiments of the present invention. The silane polymer barrier layer 402 effectively seals the glass fibers 108 and eliminates the conductive anodic filament (CAF) pathway between the PTH via that will be formed in the through-hole 302 and adjacent PTH vias.

In general, the enhanced varnish/glass substrate 400 may be any composite structure used in PCB construction, such as a prepreg or a core.

Figure 5:
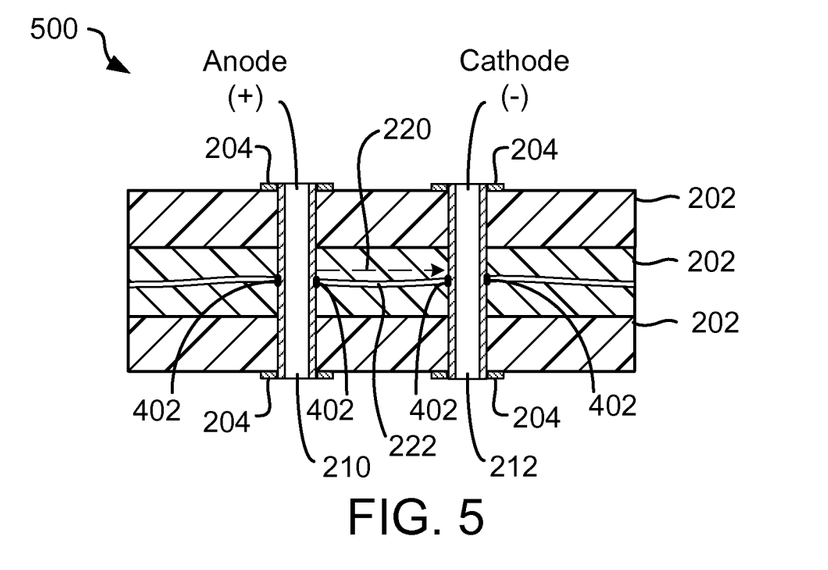
FIG. 5 is a partial, sectional view of printed circuit board (PCB) constructed using an enhanced substrate in accordance with the preferred embodiments of the present invention.

FIG. 5 is a cross-sectional view of printed circuit board (PCB) 500 constructed using an enhanced substrate in accordance with the preferred embodiments of the present invention. The PCB 500 illustrated in FIG. 5 corresponds to the conventional PCB 200 shown in FIG. 2, except that one or more silane polymer barrier layers 402 is/are formed on the end of glass fiber bundles 222 in accordance with the preferred embodiments of the present invention. The silane polymer barrier layer 402 effectively seals the glass fiber bundles 222 and eliminates the conductive anodic filament (CAF) pathway from the Anode PTH via 210 to the Cathode PTH via 212 along the glass fiber bundle 222. The CAF pathway 220 is illustrated in FIG. 5 as a "dashed-line" because this CAF pathway is eliminated by the one or more silane polymer barrier layers 402.

Figure 6:
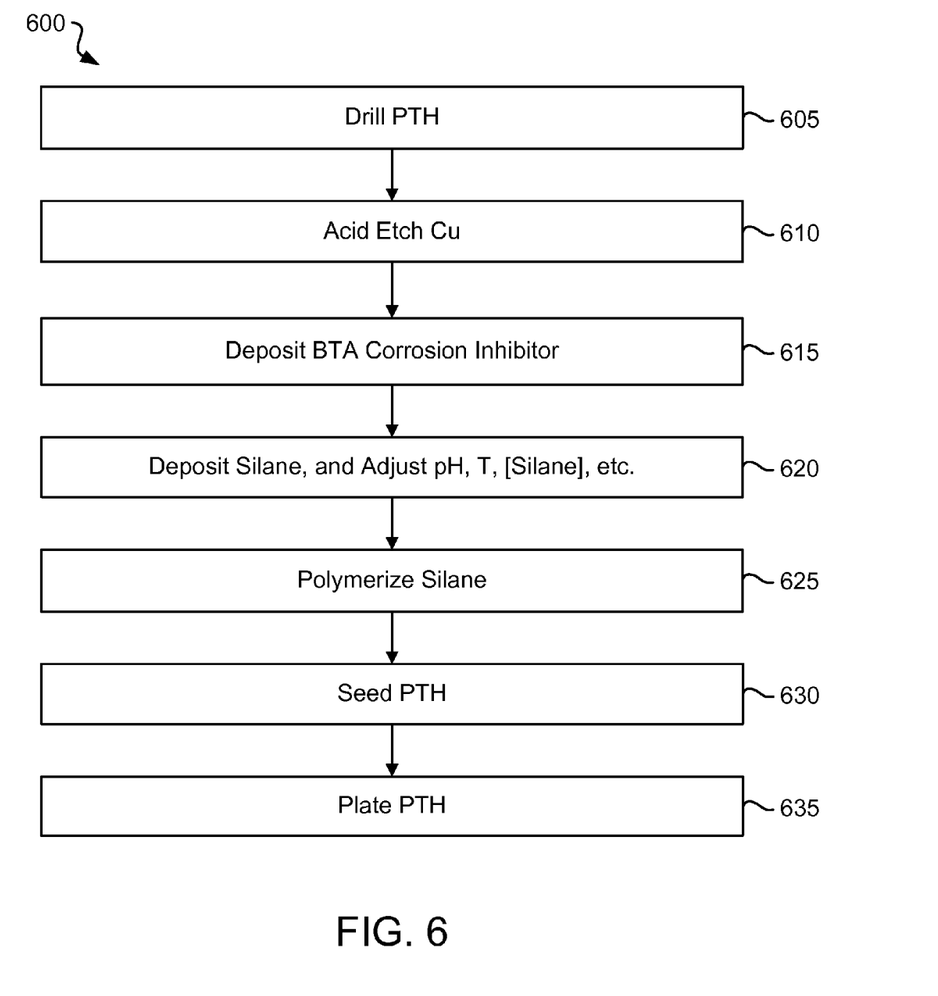
FIG. 6 is a flow diagram illustrating an exemplary method of fabricating one or more vias in a printed circuit board (PCB) or other substrate in accordance with the preferred embodiments of the present invention.

FIG. 6 is a flow diagram illustrating an exemplary method 600 of fabricating one or more vias in a printed circuit board (PCB) or other substrate in accordance with the preferred embodiments of the present invention. In the method 600, the steps discussed below (steps 605-635) are performed. These steps are set forth in their preferred order. It must be understood, however, that the various steps may occur simultaneously or at other times relative to one another. Moreover, those skilled in the art will appreciate that one or more steps may be omitted.

The method 600 begins by drilling one or more through-holes in a conventional varnish/glass substrate at one or more PTH via formation locations (step 605). Each of the through-holes extends completely through the conventional varnish/glass substrate. Conventional through-hole drilling techniques utilized in printed circuit board (PCB) fabrication are applied during this step.

Subsequent to drilling the through-holes in the conventional varnish/glass substrate, the drilled through-holes are typically desmeared. Desmear is a conventional PCB fabrication process by which epoxy resin is cleaned from the inside of drilled through-holes, typically by utilizing a permanganate solution.

Then, the method 600 continues by acid etching the conductive traces exposed in the drilled through-holes to remove oxide using conventional techniques (step 610). The conductive traces, which are typically copper, include portions that are exposed in the drilled through-holes. The exposed portions of the conductive traces may become oxidized when the through-holes are drilled and desmeared. Hence, the resulting oxide is typically removed from the exposed portions of the conductive traces by acid etching. For example, the substrate may be immersed in an acid bath. Typically, the acid bath contains a hydrochloric acid solution. One skilled in the art will appreciate, however, that one or more other conventional techniques may be used to remove oxide from the exposed portions of the conductive traces in lieu of, or in addition to, acid etching.

Subsequent to acid etching the conductive traces exposed in the drilled through-holes, the substrate is typically rinsed using conventional techniques. For example, the substrate may be subjected to a water rinse after the acid etching step.

Then, the method 600 continues by depositing benzotriazole (BTA) on the conductive traces exposed in the drilled through-holes (step 615). BTA is a conventional corrosion inhibitor. The BTA is deposited using conventional techniques. For example, the substrate may be immersed in a BTA bath, typically containing a solution of 1-3 wt % BTA dissolved in either water or ethanol, or a combination thereof. Typically, the substrate is immersed in the BTA bath for several hours at room temperature (RT) and atmospheric pressure. A suitable immersion time is empirically determined. A suitable immersion time will typically vary based on myriad factors such as the concentration of BTA in the solution, whether the solution is water-based and/or ethanol-based, the temperature of the solution, and the pressure under which immersion is performed. Generally, a suitable immersion time is 24 hours or less. The BTA coats the exposed conductive traces and prevents chemisorption of silane in one or more subsequent steps (e.g., steps 620 and 625, described below). The use of BTA is exemplary. One skilled in the art will appreciate that one or more other conventional corrosion inhibitors may be used in lieu of, or in addition to, BTA to coat the exposed conductive traces and prevent subsequent chemisorption of silane.

Next, the method 600 continues by depositing a silane on the glass fibers exposed in the drilled through-holes (step 620). The silane is deposited using conventional surface modification techniques, such as immersion or vapor pressure deposition (VPD). It is typically necessary to adjust one or more process parameters of the conventional surface modification technique used in step 620 to deposit a sufficient layer of silane on the exposed glass fiber bundle ends. The silane reacts in step 620 with the exposed silanols on the glass to form a siloxane, which can be further polymerized to form a silane polymer barrier layer on the exposed glass fiber ends (step 625). This silane polymer barrier layer effectively seals the glass bundles and eliminates the CAF pathway.

Preferably, the silane used in step 620 is one or more organo trialkoxysilanes including, but not limited to, conventional silane coupling agents such as vinylbenzylaminoethylaminopropyl-trimethoxysilane, diallylpropylisocyanuratetrimethoxysilane, and the like. Organo trialkoxysilanes, which have the general formula structure RSi(OR□)$_3$, are coupling agents. R is an organic functional group, such as an alkyl, an aryl, an alkenyl, and —NR□$_2$, SH, COOH, SO$_3$H, NCO, epoxy, acrylate functionalized organics. R□ is an alkyl, a cycloalkyl, an aryl, a heteroaryl, a non-aromatic heterocyclic ring, or an allyl. Other suitable organo trialkoxysilanes suitable for use in this depositing step include, but are not limited to, n-octyltrimethoxysilane, 3-methacryloxypropyltrimethoxysilane, n-(2-aminoethyl)-3-aminopropyltrimethoxysilane, n-[2(vinylbenzylamino)-ethyl]-3-aminopropyltrimethoxysilane, and 3-glycidoxypropyltrimethoxysilane.

Additional silanes that may be suitable for use in this depositing step include those listed in Table 1.10 "Critical Surface Tensions of Silane Coupling Agent Film" (p. 23) and Table 2.2 "Representative Commercial Silanes" (p. 34) of Plueddemann, "Silane Coupling Agents," $2^{nd}$ edition, Plenum Press, New York, 1991, hereby incorporated herein by reference.

In the case of immersion, for example, the substrate may be subjected to a silane bath, the process parameters of which (e.g., temperature, pH, silane concentration, and immersion time) are adjusted to deposit a sufficient layer of silane on the exposed glass fiber bundle ends. Suitable process parameters are empirically determined. Suitable process parameters will typically vary in an interrelated fashion and based on myriad factors such as the particular silane used in the bath, and whether the bath solution is water-based and/or alcohol-based. Generally, the temperature of the silane bath ranges from room temperature (RT) to 80° C., the silane bath is typically acidic (pH 3-5) to prevent self-condensation of the silane, and the immersion time is typically 24 hours or less. A surfactant may be added to the silane bath to enhance wetting of the glass fibers as well as prevent foaming.

Generally, in step 620 the concentration of the silane can range from 0.01 to 100% (vol), preferably 0.05 to 10% (vol) and most preferably 0.1 to 3% (vol). The duration the substrate is exposed to the silane bath can range, for example, from 0.1 minutes to 24 hours, preferably 0.5 to 180 minutes and most preferably 2 to 30 minutes, depending on the final silane surface coverage desired.

The following first illustrative example is for purposes of illustration and is non-limiting. In the first illustrative example, step 620 is performed by dipping the substrate for 2 to 30 minutes into an aqueous silane bath containing 0.1%-0.5% organo trialkoxysilane/water solution (or water-ethanol). In the first illustrative example, the organo trialkoxysilane is vinylbenzylaminoethylaminopropyl-trimethoxysilane or diallylpropylisocyanurate-trimethoxysilane. The temperature of the silane bath is within the range from room temperature (RT) to 80° C. The silane bath is made acidic (pH 3-5) to prevent self-condensation of the silane. The pH of the silane bath may be adjusted with a suitable acid, such as glacial acetic acid. The silane reacts through its trialkoxy groups with the exposed silanols on the glass to form a siloxane. The substrate is then air-dried.

As this first illustrative example continues, step 625 is performed by placing the substrate in a desiccator at 110-120° C. for 5-10 minutes. The siloxane formed in step 620 is polymerized to form a silane polymer barrier layer on the exposed glass fiber bundle ends. In this first illustrative example, the silane polymer barrier layer is formed in step 625 through the application of heat to the siloxane formed in step 620. Alternatively, one or more monomers and a thermal initiator (optional) may be added to the siloxane formed in step 620 so that the one or more added monomers participate in the polymerization along with the siloxane formed in step 620 to form the silane polymer barrier layer in step 625.

The following second illustrative example is for purposes of illustration and is non-limiting. In the second illustrative example, step 620 is performed by using an alcohol solution for silylating the surface of the substrate with an organo trialkoxysilane. A 2% silane solution can be prepared in a suitable alcohol (e.g., methanol, ethanol, isopropanol, and the like). In the second illustrative example, the organo trialkoxysilane is vinylbenzylaminoethylaminopropyl-trimethoxysilane or diallylpropylisocyanurate-trimethoxysilane. The surface of the substrate can be wiped, dipped, or sprayed with this solution. If the substrate is dipped into the solution, a sufficient submersion time (e.g., one or two minutes) may be necessary to allow silane migration to the surface of the substrate. The substrate is then dried (e.g., air-dried). After the surface of the substrate dries, excess material can be gently wiped, or briefly rinsed off with alcohol.

As this second illustrative example continues, step 625 is performed by heating the substrate for 5-10 minutes at 110° C. (alternatively, step 625 may be performed by maintaining the substrate at ambient temperature for 24 hours). The siloxane formed in step 620 is polymerized to form a silane polymer barrier layer on the exposed glass fiber bundle ends. In this second illustrative example, the silane polymer barrier layer is formed in step 625 through the application of heat to the siloxane formed in step 620. Alternatively, one or more monomers and a thermal initiator (optional) may be added to the siloxane formed in step 620 so that the one or more added monomers participate in the polymerization along with the siloxane formed in step 620 to form the silane polymer barrier layer in step 625.

The following third illustrative example is for purposes of illustration and is non-limiting. In the third illustrative example, step 620 is performed by placing the substrate in a vapor phase of an organo trialkoxysilane. In the third illustrative example, the organo trialkoxysilane is vinylbenzylaminoethylaminopropyl-trimethoxysilane or diallylpropylisocyanurate-trimethoxysilane. To modify the exposed glass fiber bundle ends with the silane using vapor phase deposition techniques, the substrate must be passed through or placed within a chamber that allows for the silane to build up a vapor pressure. Such vapor deposition techniques are well known by those skilled in the art.

As this third illustrative example continues, step 625 is performed by removing the substrate from the chamber and heating the substrate for 5-10 minutes at 110° C. The siloxane formed in step 620 is polymerized to form a silane polymer barrier layer on the exposed glass fiber bundle ends. In this third illustrative example, the silane polymer barrier layer is formed in step 625 through the application of heat to the siloxane formed in step 620. Alternatively, one or more monomers and a thermal initiator (optional) may be added to the siloxane formed in step 620 so that the one or more added monomers participate in the polymerization along with the siloxane formed in step 620 to form the silane polymer barrier layer in step 625.

In addition, an optional silane composition may be added to the siloxane formed in step 620 or the silane polymer barrier layer formed in step 625 to form a hydrophobic silane coating, which is an intermixed layer containing both silanes. Such a hydrophobic silane coating for preventing conductive anode filament (CAF) is disclosed in U.S. patent application Ser. No. 12/718,213, assigned to International Business Machines Corporation, which is hereby incorporated herein by reference in its entirety.

The optional silane composition used to form the hydrophobic silane coating (an intermixed layer containing both silanes) typically includes a silane having a general formula structure $R_1$—Si—$R_{(2-4)}$, wherein $R_1$ is a functional group that is reactive with alcohols, water and/or surface silanols, and wherein $R_2$, $R_3$ and $R_4$ are each a functional group that is hydrophobic and non-reactive (i.e., $R_2$, $R_3$ and $R_4$ are each non-reactive with the alcohols, water and/or surface silanols with which $R_1$ is reactive). Examples of suitable silanes for the silane composition include (without limitation) chlorotrimethylsilane (i.e., $(CH_3)_3SiCl$, also known as trimethylsilylchloride or TMSCl), hexamethyldisilazane (i.e., $[(CH_3)_3Si]_2NH$, also known as HMDS or HMDZ), perfluorooctyl-1H,1H,2H,2H-dimethylchlorosilane (i.e., $C_{10}H_{10}ClF_{13}Si$), and (3,3,3-trifluoropropyl)dimethyl-chlorosilane (i.e., $C_5H_{10}ClF_3Si$); and combinations thereof.

Once the silane polymer barrier layer is formed, the substrate may then be further processed using conventional PCB fabrication techniques, such as depositing Cu plating seed (step 630) and Cu plating to form the conductive PTH vias (step 635). In step 630, Cu plating seed is deposited in the through-holes. Conventional seeding techniques utilized in PCB fabrication are applied during this step. In step 635, the through-holes are plated with Cu to form the PTH vias. Conventional plating techniques (i.e., conventional electroless plating techniques and/or conventional electroplating techniques) utilized in PCB fabrication are applied during this step. One skilled in the art will appreciate that any desired metal may be used to form the PTH vias through the use of suitable conventional seeding/plating techniques.

One skilled in the art will appreciate that many variations are possible within the scope of the present invention. For example, although the preferred embodiments of the present invention are described herein in the context of a printed circuit board (PCB), the present invention may be utilized in the context of other substrates, such as a laminate subcomposite, an interconnect substrate (e.g., an interposer or a module substrate) or a flex cable. Likewise, the present invention may be utilized in the context of forming all type of vias, including PTH vias, buried vias, and blind vias. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. An apparatus, comprising:
  a substrate having a plurality of insulator layers and one or more conductive traces, wherein each of the insulator layers comprises a glass fiber substrate impregnated with a varnish coating, wherein a plurality of through-holes each of which extends completely through the substrate from a first surface of the substrate to a second surface of the substrate and passes through the glass fiber substrate of each of the insulator layers, and wherein the glass fiber substrate of one of the insulator layers includes one or more glass fibers extending from a first one of the through-holes to a second one of the through-holes;
  a silane polymer barrier layer formed over a first end of each of the one or more glass fibers in the first one of the through-holes;
  a silane polymer barrier layer formed over a second end of each of the one or more glass fibers in the second one of the through-holes.

2. The apparatus as recited in claim 1, wherein a first plated through-hole (PTH) via is formed in the first one of the through-holes and a second plated through-hole (PTH) via is formed in the second one of the through-holes, and wherein the first PTH via operates at a voltage higher than that of the second PTH via such that the first and second PTHs together comprise an anode/cathode pair.

3. The apparatus as recited in claim 1, wherein the apparatus is a printed circuit board (PCB).

4. The apparatus as recited in claim 3, wherein the glass fiber substrate is a glass cloth constructed of glass fiber bundles woven together in an orthogonal fashion, and wherein the glass fiber bundles include the one or more glass fibers.

5. The apparatus as recited in claim 4, wherein the varnish coating is selected from a group of materials consisting of an epoxy-based resin, a bismaleimide triazine (BT) resin, polyyphenylene oxide/triallylisocyanurate (TAIC), and combinations thereof.

6. An apparatus, comprising:
  a substrate having a plurality of insulator layers and one or more conductive traces, wherein each of the insulator layers comprises a glass fiber substrate impregnated with a varnish coating, wherein a plurality of via holes each of which extends at least partially through the substrate and passes through the glass fiber substrate of at least one of the insulator layers, and wherein the glass fiber substrate of one of the insulator layers includes one or more glass fibers extending from a first one of the via holes to a second one of the via holes;
  a silane polymer barrier layer formed over a first end of each of the one or more glass fibers in the first one of the via holes;
  a silane polymer barrier layer formed over a second end of each of the one or more glass fibers in the second one of the via holes.

7. The apparatus as recited in claim 6, wherein a first plated through-hole (PTH) via is formed in the first one of the via holes and a second plated through-hole (PTH) via is formed in the second one of the via holes, and wherein the first PTH via operates at a voltage higher than that of the second PTH via such that the first and second PTHs together comprise an anode/cathode pair.

8. The apparatus as recited in claim 6, wherein the apparatus is a printed circuit board (PCB).

9. The apparatus as recited in claim 8, wherein the glass fiber substrate is a glass cloth constructed of glass fiber bundles woven together in an orthogonal fashion, and wherein the glass fiber bundles include the one or more glass fibers.

10. The apparatus as recited in claim 9, wherein the varnish coating is selected from a group of materials consisting of an epoxy-based resin, a bismaleimide triazine (BT) resin, polyyphenylene oxide/triallylisocyanurate (TAIC), and combinations thereof.

11. A method comprising the steps of:
  providing a substrate having a plurality of insulator layers and one or more conductive traces, wherein each of the insulator layers comprises a glass fiber substrate impregnated with a varnish coating, wherein a plurality of through-holes each of which extends completely through the substrate from a first surface of the substrate to a second surface of the substrate and passes through the glass fiber substrate of each of the insulator layers, and wherein the glass fiber substrate of one of the insulator layers includes one or more glass fibers extending from a first one of the through-holes to a second one of the through-holes;
  forming a silane polymer barrier layer over a first end of each of the one or more glass fibers in the first one of the through-holes;
  forming a silane polymer barrier layer over a second end of each of the one or more glass fibers in the second one of the through-holes.

12. The method as recited in claim 11, wherein the step of forming a silane polymer barrier over a first end of each of the one or more glass fibers in the first one of the through-holes and the step of forming a silane polymer barrier layer over a second end of each of the one or more glass fibers in the second one of the through-holes are performed substantially simultaneously.

13. The method as recited in claim 12, wherein the silane polymer barrier layer is formed over the first and second ends of each of the one or more glass fibers using an aqueous silane bath.

14. The method as recited in claim 12, wherein the silane polymer barrier layer is formed over the first and second ends of each of the one or more glass fibers using vapor phase deposition.

15. The method as recited in claim 11, wherein the step of forming a silane polymer barrier layer over the first end of each of the glass fibers in the first one of the through-holes and the step of forming a silane polymer barrier layer over a second end of each of the one or more glass fibers in the second one of the through-holes each includes the steps of:
   depositing an organo trialkoxy silane on the respective end of each of the one or more glass fibers exposed on the wall surface of the respective one of the through-holes to form a siloxane over the respective end of each of the glass fibers;
   polymerizing the siloxane to form the silane polymer barrier layer.

16. The method as recited in claim 15, wherein the organo trialkoxy silane is selected from a group consisting of vinyl-benzylaminoethylaminopropyl-trimethoxysilane, diallylpropylisocyanuratetrimethoxysilane, n-octyltrimethoxysilane, and combinations thereof.

17. The method as recited in claim 15, further comprising the step of:
   prior to the step of depositing an organo trialkoxy silane on the respective end of each of the one or more glass fibers exposed on the wall surface of the respective one of the through-holes, depositing a corrosion inhibitor on an end of each conductive trace exposed on the wall surface of the respective one of the through-holes.

18. The method as recited in claim 17, wherein the corrosion inhibitor is bezotriazole (BTA).

19. The method as recited in claim 11, further comprising the steps of:
   applying a silane composition to the silane polymer barrier layer formed over the first and second ends of each of the one or more glass fibers in the first and second ones of the through-holes, respectively, to form a hydrophobic silane coating, wherein the silane composition includes a silane having a general structure $R_1$—Si—$R_{(2,3,4)}$, wherein $R_1$ is a functional group that is reactive with alcohols, water and/or the one or more surface silanols, and wherein $R_2$, $R_3$ and $R_4$ are each a functional group that is hydrophobic and non-reactive with the alcohols, water and/or the one or more surface silanols with which $R_1$ is reactive.

* * * * *